(12) United States Patent
Kim

(10) Patent No.: US 8,297,793 B2
(45) Date of Patent: Oct. 30, 2012

(54) LIGHT EMITTING DEVICE AND METHOD OF MANUFACTURING THE SAME

(75) Inventor: Wan Ho Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 487 days.

(21) Appl. No.: 12/438,850

(22) PCT Filed: Sep. 13, 2007

(86) PCT No.: PCT/KR2007/004423
§ 371 (c)(1),
(2), (4) Date: Feb. 25, 2009

(87) PCT Pub. No.: WO2008/038915
PCT Pub. Date: Apr. 3, 2008

(65) Prior Publication Data
US 2009/0201662 A1  Aug. 13, 2009

(30) Foreign Application Priority Data
Sep. 25, 2006  (KR) .................. 10-2006-0092896

(51) Int. Cl.
*F21V 1/00* (2006.01)

(52) U.S. Cl. ....... 362/249.06; 257/88; 257/98; 313/500; 313/502; 362/231; 362/249.02; 362/249.05; 362/545

(58) Field of Classification Search ............. 257/88, 257/98; 313/500, 502; 362/231, 249.02, 362/249.05, 249.06, 244, 545, 555, 612, 362/800
See application file for complete search history.

(56) References Cited

U.S. PATENT DOCUMENTS

| | | | |
|---|---|---|---|
| 2002/0175632 A1* | 11/2002 | Takeguchi | 315/169.1 |
| 2004/0188700 A1 | 9/2004 | Fukasawa et al. | |
| 2006/0245188 A1* | 11/2006 | Takenaka | 362/231 |
| 2009/0309485 A1 | 12/2009 | Tamaki et al. | |

FOREIGN PATENT DOCUMENTS

| | | |
|---|---|---|
| JP | 2001-24238 A | 1/2001 |
| JP | 2003-17753 A | 1/2003 |
| JP | 2004-071726 A | 3/2004 |
| JP | 2006-196777 A | 7/2006 |
| KR | 10-2005-0006455 A | 1/2005 |
| WO | WO-2004/053933 A2 | 6/2004 |

* cited by examiner

*Primary Examiner* — Stephen F Husar
(74) *Attorney, Agent, or Firm* — Birch, Stewart, Kolasch & Birch, LLP

(57) ABSTRACT

Disclosed is a light emitting device and a method of manufacturing the same. The light emitting device comprises a substrate comprising a cavity, a multi-color light emitting unit on a first region of the cavity, and a white light emitting unit on a second region of the cavity.

20 Claims, 7 Drawing Sheets

[Fig. 1]
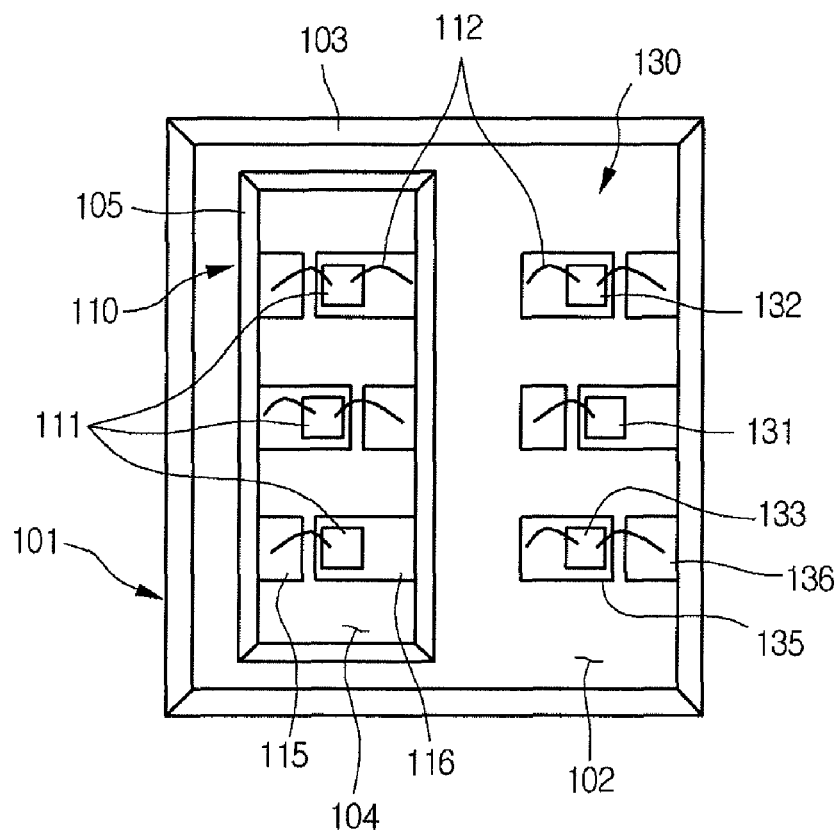
[Fig. 2]
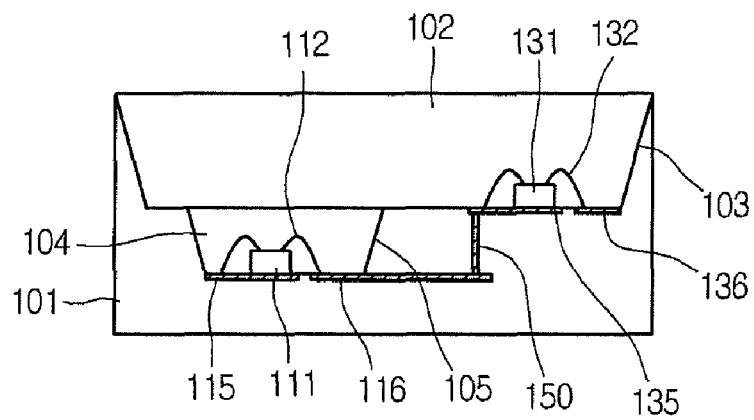

[Fig. 3]
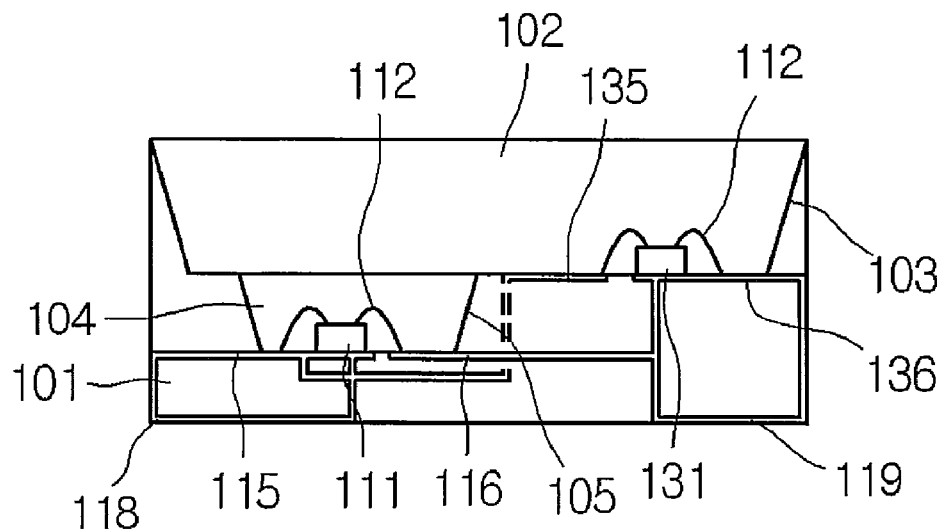
[Fig. 4]
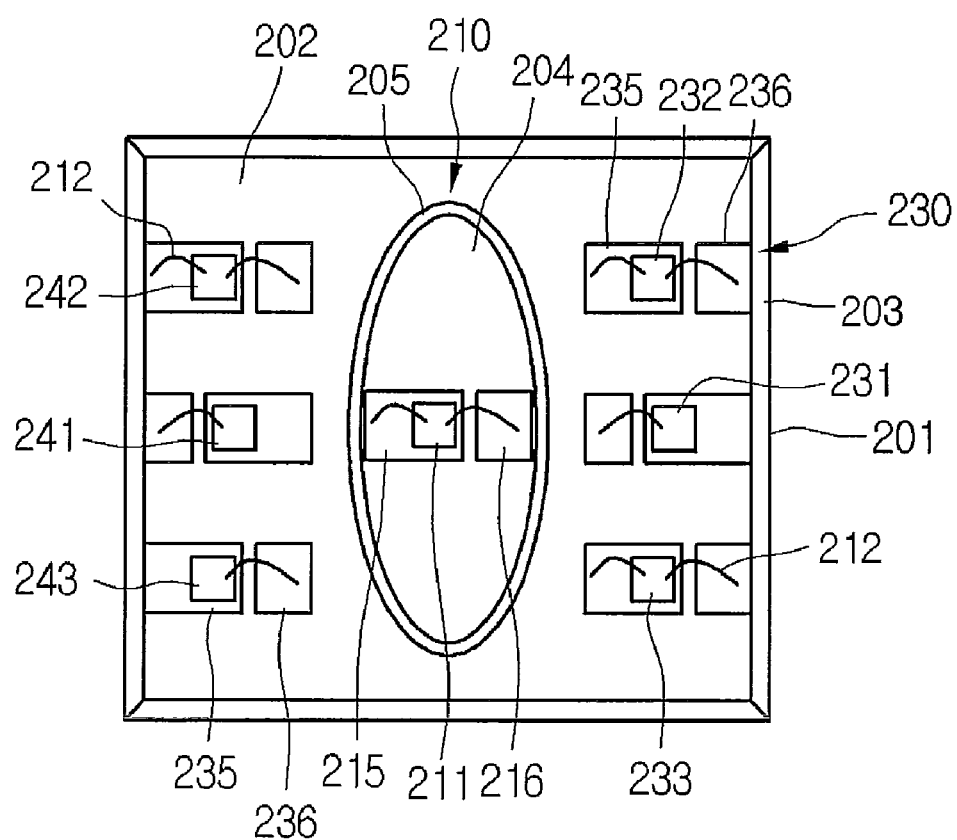

[Fig. 5]
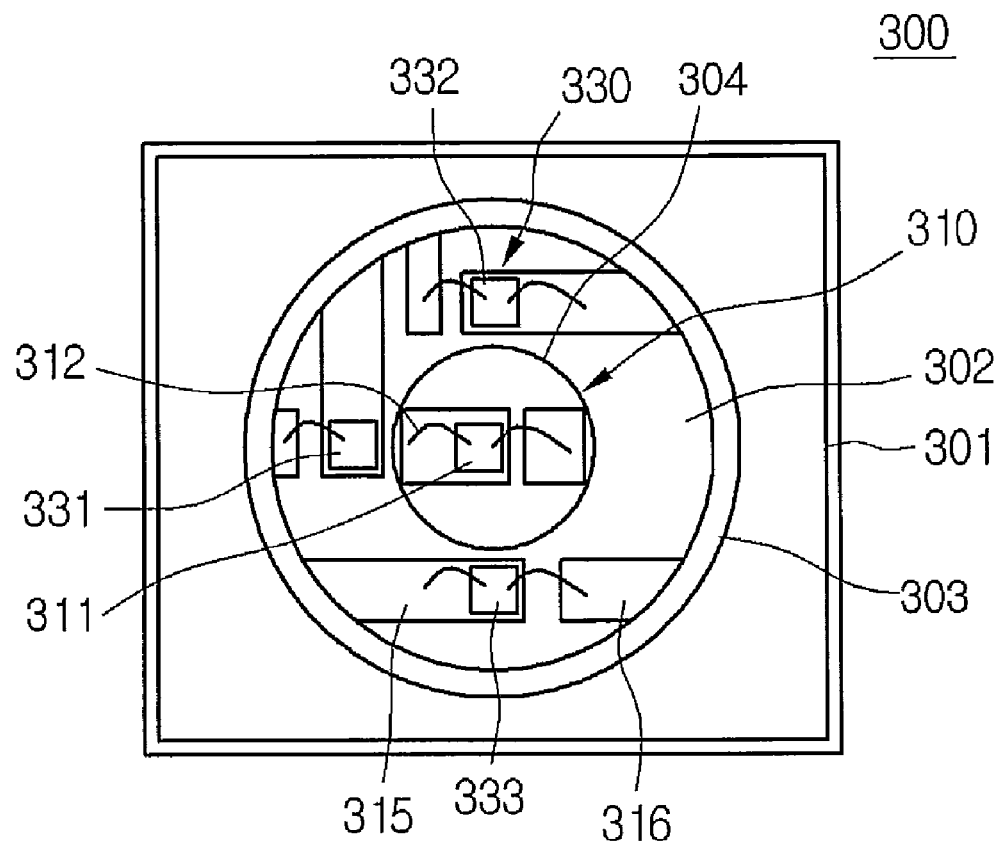
[Fig. 6]
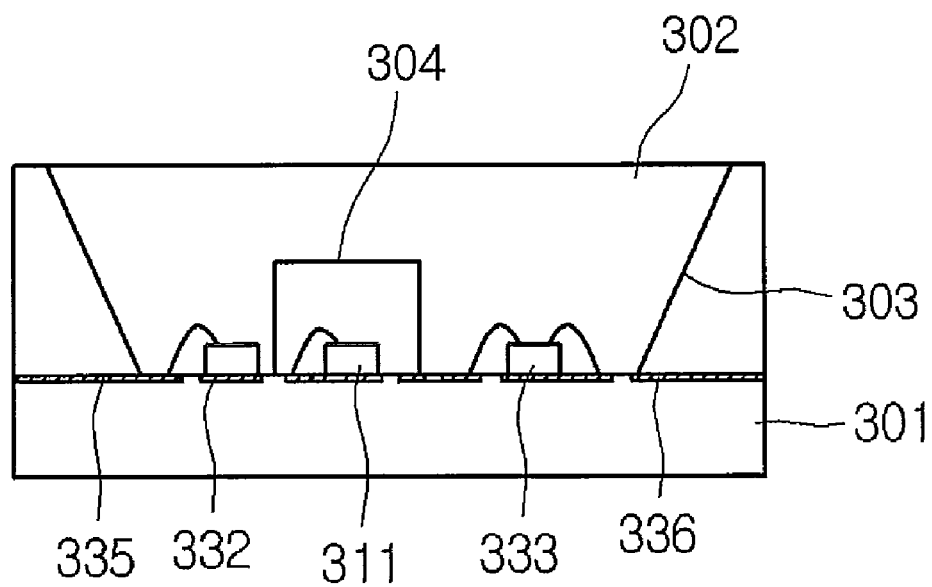

[Fig. 7]
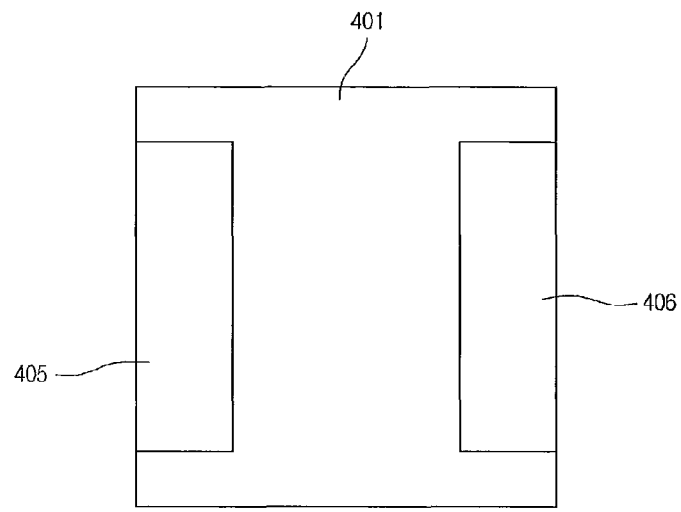
[Fig. 8]
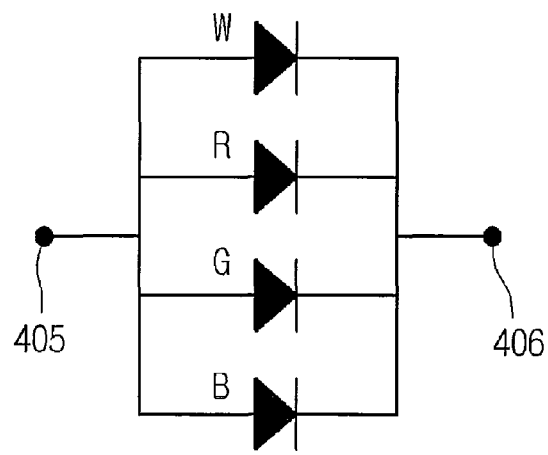
[Fig. 9]
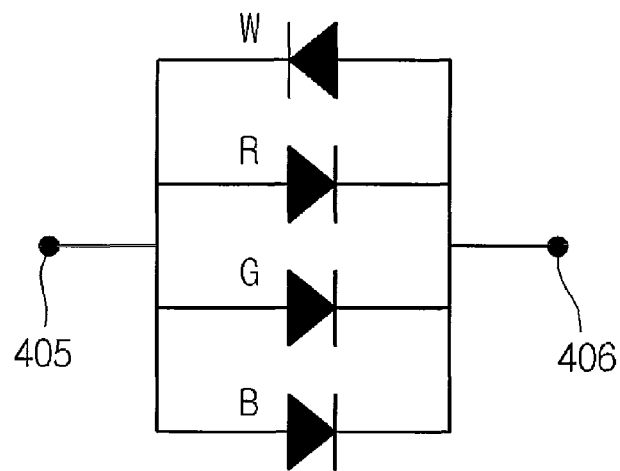

[Fig. 10]
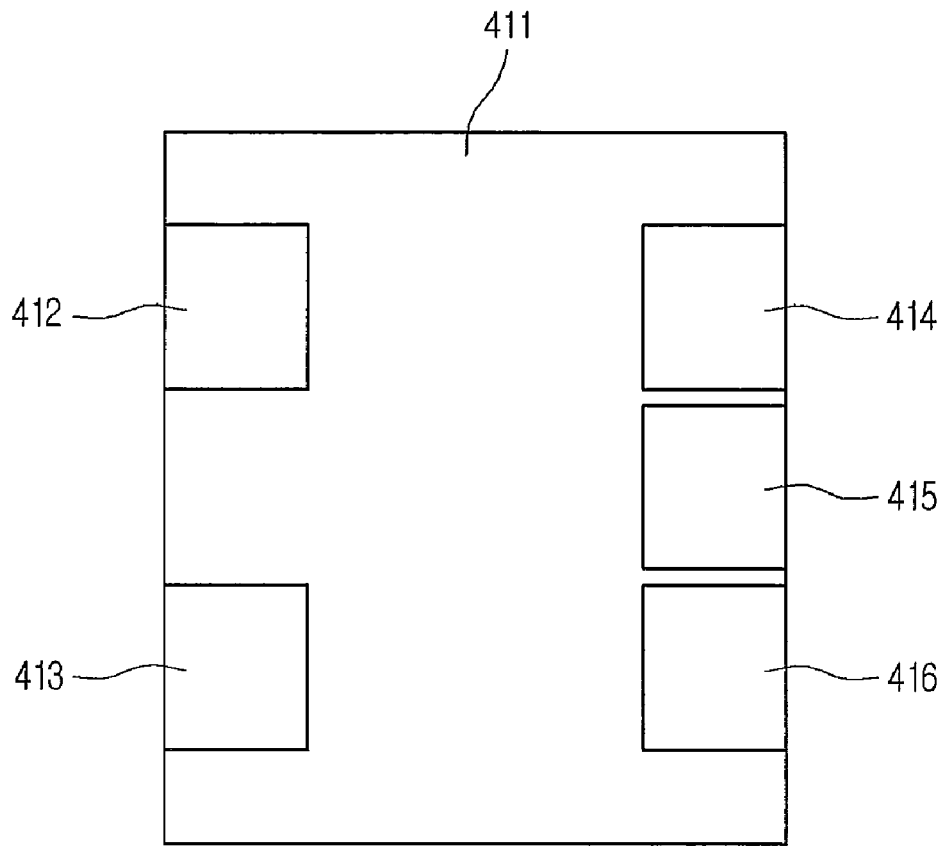
[Fig. 11]
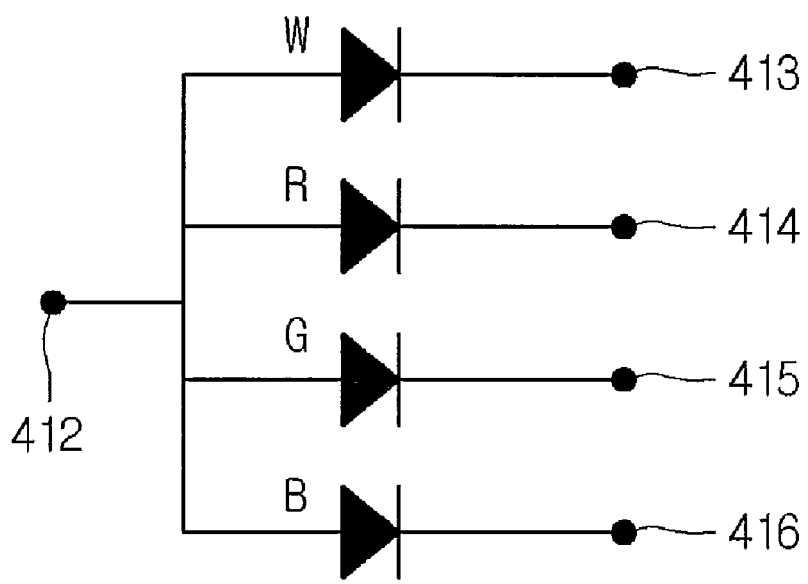

[Fig. 12]
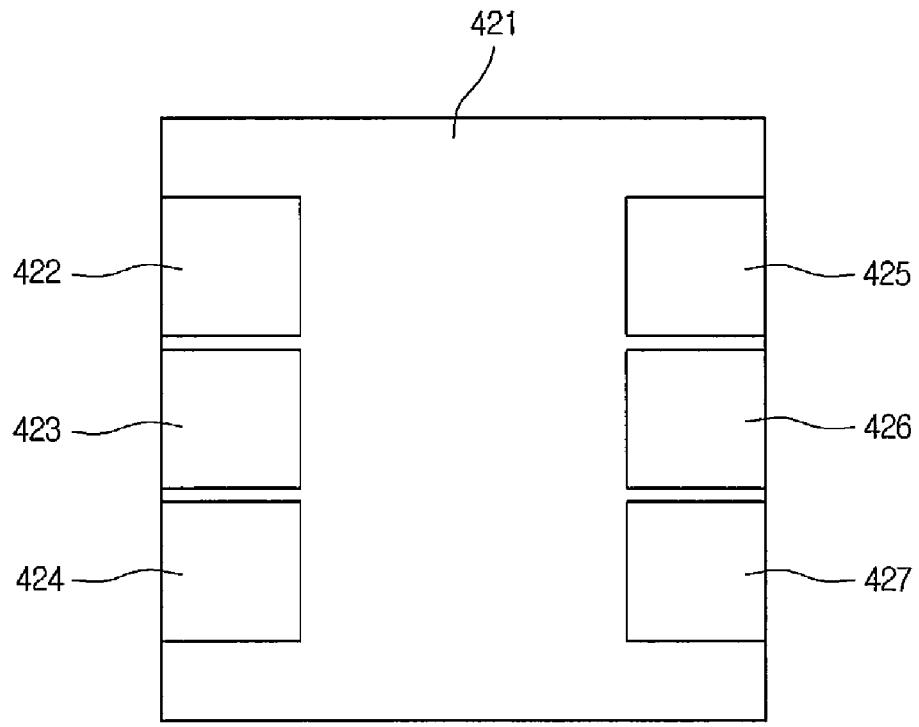
[Fig. 13]
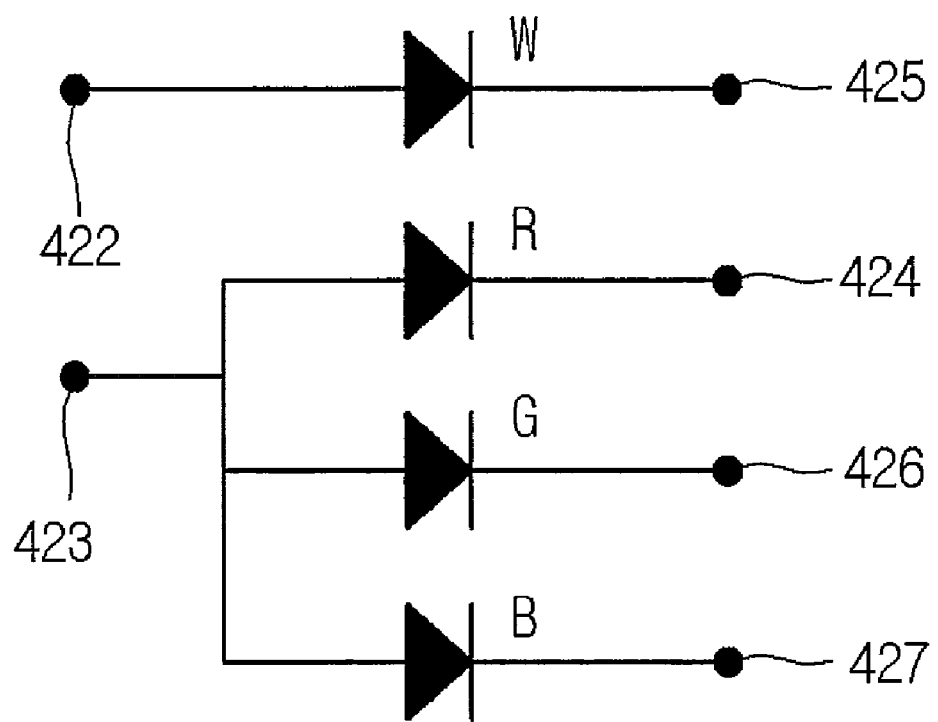

[Fig. 14]
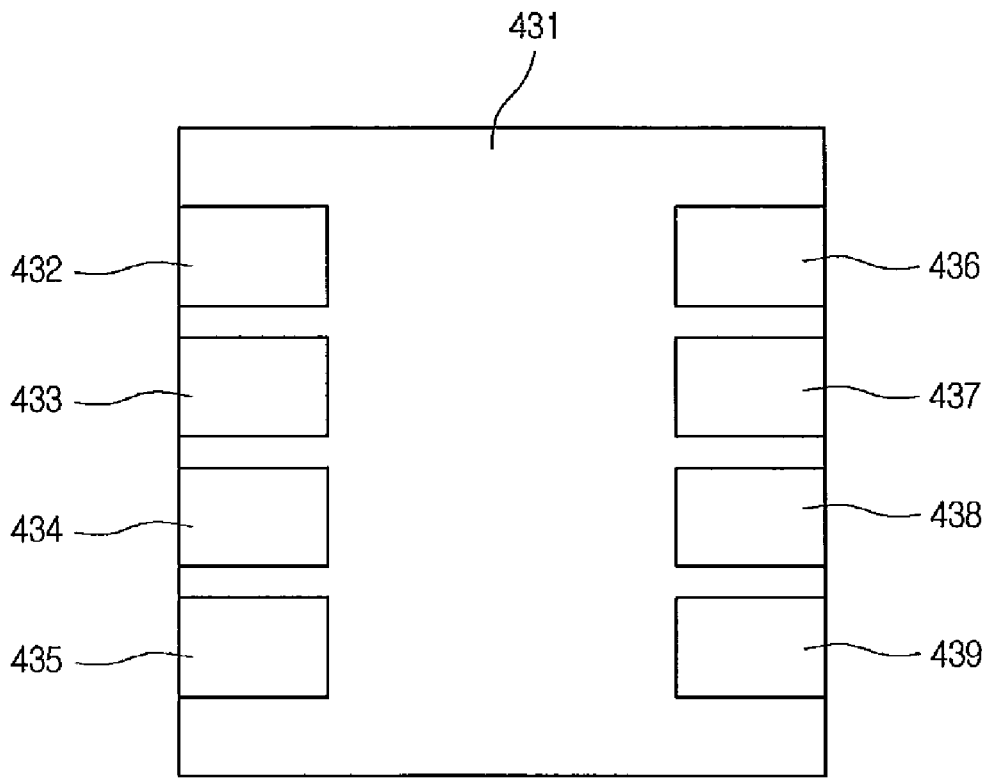
[Fig. 15]
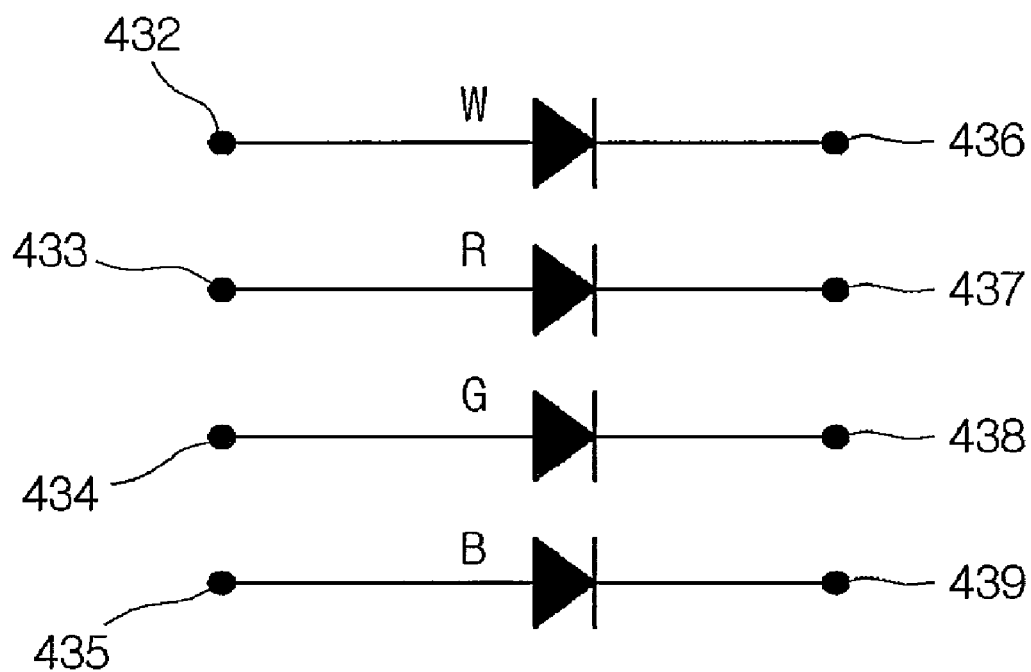

LIGHT EMITTING DEVICE AND METHOD OF MANUFACTURING THE SAME

TECHNICAL FIELD

The embodiment relates to a light emitting device and a method of manufacturing the same.

BACKGROUND ART

Light Emitting Diodes (LEDs) use GaAs, AlGaAs, GaN, InGaN and InGaAlP-based compound semiconductor materials to constitute a light emitting source, thereby realizing various colors.

Characteristics of the LEDs are determined depending on materials, colors, brightness and brightness intensity of the compound semiconductor materials. In addition, the LEDs are fabricated in the form of packages and are applied to various fields of a lightening indicator, a character displayer and an image displayer.

DISCLOSURE OF INVENTION

Technical Problem

The embodiment provides a light emitting device and a method of manufacturing the same, in which a white light emitting unit and a multi-color light emitting unit are embodied in a single package, thereby emitting required colors through the single package.

The embodiment provides a light emitting device and a method of manufacturing the same, capable of improving the color rendering characteristics of light emitted from packages and enhancing the light intensity.

Technical Solution

The light emitting device according to the embodiment comprises a substrate comprising a cavity, a multi-color light emitting unit on a first region of the cavity, and a white light emitting unit on a second region of the cavity.

The light emitting device according to the embodiment comprises a substrate comprising a cavity, a white light emitting unit that is on a second region of the cavity and comprises at least one blue LED and a fluorescent substance, and a multi-color light emitting unit that is on a first region of the cavity and comprises at least one red LED, green LED and blue LED.

The method of manufacturing the light emitting device according to the embodiment comprises the steps of forming a cavity in a substrate, mounting a red LED, a green LED and a blue LED on a first region of the cavity, mounting a blue LED on a second region of the cavity, forming a second mold member, to which a fluorescent substance is added, on the second region of the cavity, and forming a first mold member on the first region of the cavity after the second mold member has been cured.

Advantageous Effects

According to a light emitting device and a method of manufacturing the same of the embodiment, diodes, which are individually driven to emit white light and three color lights, are fabricated in the form of a single package, so that the light emitting device can be used for a flash light source of a portable terminal.

In addition, the embodiment can provide a package capable of selectively emitting white light or/and other light.

Further, since white light emitting diode and three-color light emitting diodes are simultaneously driven in a package when emitting the white light, the light rendering characteristics can be enhanced and the light intensity can be improved as compared with those of the conventional package.

In addition, the light emitting device of the embodiment can be used as an indicator package by employing a multi-color light source.

BRIEF DESCRIPTION OF THE DRAWINGS

FIG. 1 is a plan view representing a light emitting device according to a first embodiment;

FIG. 2 is a side sectional view representing the light emitting device shown in FIG. 1;

FIG. 3 is a side sectional view representing electrode terminals of the light emitting device shown in FIG. 1;

FIG. 4 is a plan view representing a light emitting device according to a second embodiment;

FIG. 5 is a plan view representing a light emitting device according to a third embodiment;

FIG. 6 is a side sectional view representing the light emitting device shown in FIG. 5;

FIGS. 7 to 9 are views representing a first circuit configuration of the light emitting device employing two electrode terminals according to the embodiment;

FIGS. 10 and 11 are views representing a second circuit configuration of the light emitting device employing five electrode terminals according to the embodiment;

FIGS. 12 and 13 are views representing a third circuit configuration of the light emitting device employing six electrode terminals according to the embodiment; and FIGS. 14 and 15 are views representing a fourth circuit configuration of the light emitting device employing eight electrode terminals according to the embodiment.

BEST MODE FOR CARRYING OUT THE INVENTION

Hereinafter, a liquid crystal display according to the embodiment will be described with reference to accompanying drawings.

First Embodiment

FIGS. 1 to 3 represent a first embodiment. FIG. 1 is a plan view of a light emitting device, FIG. 2 is a side sectional view of the light emitting device shown in FIG. 1, and FIG. 3 is a side sectional view representing electrode terminals of the light emitting device shown in FIG. 1.

Referring to FIGS. 1 and 2, a light emitting device 100 includes a substrate 101, first and second cavities 102 and 104 that are formed in different layers, a white light emitting unit 110 and a multi-color light emitting unit 130.

The substrate 101 includes ceramic materials, a common Printed Circuit Board (PCB) or silicon materials. This substrate 101 has a multi-layer structure, in which the first and second cavities 102 and 104 are formed in the different layers through an injection molding process. A via hole 150 is formed in the substrate 101 to provide a heat emission path for a light emitting diode (LED).

The first cavity 102 may be formed in a second layer of the substrate 101, and the second cavity 104 may be formed in a third layer or below. That is, the second cavity 104 is formed inside of the first cavity 102 in a layer below the first cavity 102. In addition, the first and second cavities 102 and 104 may be disposed on the left side and the right side of the substrate 101, respectively. The location of the cavities is not limited in the embodiment.

The first cavity 102 has a quadrangle shape or a rectangle shape, and the second cavity 104 has a quadrangle shape or a rectangle shape, which is smaller than that of the first cavity 102. A first side surface 103 and a second side surface 105 having an inclined structure are formed around the first cavity 102 and the second cavity 104, respectively. The first and second side surfaces 103 and 105 are coated with materials having a high reflection coefficient (e.g., Ag and Al).

In addition, a plurality of lead frames 135 and 136 are formed on a bottom surface of the first cavity 102, and a plurality of lead frames 115 and 116 are formed on a bottom surface of the second cavity 104.

The multi-color light emitting unit 130 is disposed in the first cavity 102, and the white light emitting unit 110 is disposed in the second cavity 104.

The white light emitting unit 110 includes at least one blue light emitting diode 111, and a plurality of the blue light emitting diodes 111 may be arranged in a row or in a zig-zag manner. The blue light emitting diode 111 is connected to the lead frames 115 and 116 by at least one wire 112 and/or one conductive member (e.g., a conductive adhesive). In this case, at least one of the blue light emitting diodes 111 may be mounted through a flip chip technology.

A second mold member is molded on a region of the second cavity 104 having the white light emitting unit 110. The second mold member is formed of transmissive silicon materials or epoxy materials, and includes a fluorescent substance (not shown) emitting a predetermined light. The fluorescent substance, which is added to the second mold member, includes a yellow fluorescent substance that is excited by light emitted from the blue light emitting diode 111 to emit yellow light. The white light emitting unit 110 emits white light through a combination of blue light emitted from the blue light emitting diode 111 and yellow light emitted from the fluorescence substance.

In addition, the white light emitting unit 110 includes an Ultra Violet (UV) LED and three types of fluorescent substances (e.g., a red fluorescent substance, a green fluorescent substance and a blue fluorescent substance). In addition, the white light emitting diode 110 may include three color LEDs (e.g., red, blue and green LEDs) or selectively include two color LEDs and the fluorescent substances.

The multi-color light emitting unit 130 uses three color diodes having different light emission spectrums. For example, the three color diodes include at least one red LED 131, green LED 132 and blue LED 133, thereby emitting at least seven color lights. Selectively, the multi-color light emitting unit 130 can be realized by using LEDs that display two colors among the three colors and the fluorescent substance. Hereinafter, the structure of the multi-color light emitting unit having the three color light emitting diodes will be described.

The three color light emitting diodes 131, 132 and 133 are connected to the lead frames 135 and 136 through at least one wire 112 and/or the conductive member (e.g., a conductive adhesive). At least one of the three color light emitting diodes 131, 132 and 133 can be connected through the flip chip technology.

A first mold member is formed on a region of the first cavity 102, in which the multi-color light emitting unit 130 is formed. The first mold member includes transmissive silicon materials or epoxy materials, and is dispensed after the second mold member of the second cavity 104 has been cured. In this case, the first mold member is formed on the region of the first cavity 102 and on the second mold member. In addition, a lens (e.g., a convex lens) may be attached to the first mold member.

In operation of the light emitting device 100, if the blue light emitting diode 111 of the white light emitting unit 110 operates, white light is emitted. In addition, if the blue light emitting diode 111 of the white light emitting unit 110 and the three color light emitting diodes 131, 132 and 133 of the multi-color emitting unit 130 simultaneously operate, white light is emitted.

The light emitting device is selectively controlled through an individual driving scheme, a local driving scheme or a full driving scheme according to a circuit configuration of the lead frames 115 and 116 of the blue light emitting diode 111 and the lead frames 135 and 136 of the three color light emitting diodes 131, 132 and 133. If the LED 111 of the white light emitting unit 110 and the LEDs 131, 132 and 133 among the multi-color light emitting unit 130 are individually driven, one of white light, red light, green light and blue light is emitted. If at least two LEDs are driven through the local driving scheme, light, which is obtained by mixing at least two of white light, red light, green light and blue light, is emitted. In addition, if all LEDs are simultaneously driven, white light is emitted.

In addition, the first side surface 103 of the first cavity 102 and the second side surface 105 of the second cavity 104 reflect the light emitted from the light emitting diodes 111, 131, 132 and 133.

Referring to FIG. 3, at least two electrode terminals 118 and 119 are formed on a bottom surface of the substrate 101. The two electrode terminals 118 and 119 serve as a common anode terminal and a common cathode terminal, respectively.

Second Embodiment

FIG. 4 is a plan view of a light emitting device according to a second embodiment.

Referring to FIG. 4, a light emitting device 200 includes a substrate 201, first and second cavities 202 and 204 that are formed in different layers, a white light emitting unit 210 formed at the center of the substrate 201 and a multi-color light emitting unit 230 formed on a peripheral region of the substrate 201.

The first cavity 202 has a quadrangle shape, and the second cavity 204 is formed at the center of the substrate 201 in a polygonal shape (e.g., a quadrangle shape), a circular shape or an oval shape. The first cavity 202 may be formed in a circular shape.

The white light emitting unit 210 is disposed in the second cavity 204, and the multi-color light emitting unit 230 is disposed in the first cavity 202 formed at both sides of the second cavity 204. The second cavity 204 is formed below the first cavity 202 corresponding to the center region of the first cavity 202. That is, the multi-color light emitting unit 230 is disposed on the left/right sides of the white light emitting unit 210.

A plurality of lead frames 215 and 216 are formed in the second cavity 204 of the white light emitting unit 210, and at least one blue light emitting diode 211 is connected to the lead frames 215 and 216. A transmissive mold member (not shown), to which fluorescent substances are added, is molded in the second cavity 204. In addition, the white light emitting unit 210 may include at least one UV LED and three kinds of fluorescent substances, instead of the blue light emitting diode 211.

In addition, the multi-color light emitting unit 230 uses three color light emitting diodes 231, 232, 233, 241, 242 and 243. The three color light emitting diodes 231, 232, 233, 241, 242 and 243 are connected to the lead frames 235 and 236 formed in the first cavity 202, and are protected by the transmissive mold member. In the three color light diodes 231, 232, 233, 241, 242 and 243, the number of the red LED, green LED and blue LED is one or at least two.

The blue LED 211 of the white light emitting unit 210 and the three color light diodes 231, 232, 233, 241, 242 and 243 of the multi-color light emitting unit 230 are driven through the individual driving scheme, the local driving scheme or the full driving scheme.

Third Embodiment

FIGS. 5 and 6 are views representing a light emitting device according to a third light emitting device.

Referring to FIGS. 5 and 6, the light emitting device 300 includes a cavity 302 having a single layer, a white light emitting unit 310 and a multi-color light emitting unit 330. The cavity 302 has a circular shape and a side surface 303 of the cavity 302 is inclined.

The white light emitting unit 310 is disposed at the center of the cavity 302. In this case, the white light emitting unit 310 may be disposed in other region, and the position of the white light emitting unit 310 is not limited thereto.

The multi-color light emitting unit 330 is disposed around the white light emitting unit 310 in a triangular structure.

The white light emitting unit 310 includes a blue light emitting diode 311 and a second mold member 304 to which fluorescent substances are added. The second mold member 304 is formed around the blue light emitting diode 311 in a predetermined shape through a transfer molding process. In this case, the second mold member 304 has a cylindrical shape or a poly-column shape according to a mold structure of a transferring molding device.

The multi-color light emitting unit 330 is formed on a region of the cavity 302 on which the second mold member 304 is not formed. The multi-color light emitting unit 330 includes a red LED 331, a green LED 332 and a blue LED 333, and the red, green and blue LEDs 331, 332 and 333 are disposed around the white light emitting unit 310 in a triangular structure.

The three color LEDs 331, 332 and 333 are connected to a plurality of lead frames 315 and 316 by using at least one wire 312 and/or a conductive member (e.g., a conductive adhesive). A first mold member is molded around the second mold member 304 in the cavity 302. The first mold member is molded on a region for the multi-color light emitting unit 330, and includes transmissive epoxy materials or silicon materials.

In addition, when the white light emitting diode 311 and the three color light emitting diodes 331, 332 and 333 that are arranged in a triangular structure are simultaneously turned on/off, the deviation in color sensitivity of white light can be minimized, and the color rendering index of white light and white light characteristics can be enhanced.

FIGS. 7 to 12 are views representing circuit configurations according to the number of electrode terminals formed on the bottom surface of the substrate.

FIGS. 7 to 9 are a view representing a first circuit employing two electrode terminals.

Referring to FIG. 7, two electrode terminals 405 and 406 are formed on a bottom surface 401 of the substrate. The two electrode terminals 405 and 406 serve as a cathode terminal and an anode terminal, respectively.

Referring to FIG. 8, anode terminals of a white LED and three color LEDs (a red LED, a green LED and a blue LED) are commonly connected to a first electrode terminal 405 of the two electrode terminals 405 and 406, and cathode terminals of the white LED and the three color LEDs are connected to a second electrode terminal 406. The white light LED is defined as a blue LED or an UV LED of the white light emitting unit.

Referring to FIG. 9, the anode terminals of the three color light emitting diodes (Red LED, Green LED and Blue LED) and the cathode terminal of the white LED are connected to the first electrode terminal 405 of the two electrode terminals 405 and 406. The cathode terminals of three color light emitting diodes (Red LED, Green LED and Blue LED) and the anode terminal of the white LED are connected to the second electrode terminal 406 of the two electrode terminals 405 and 406.

As described above, the three color LEDs form a forward circuit, and the white LED is connected to the circuit of the three color LEDs in a reverse direction. The three color light emitting diodes and the white light emitting diode are driven according to a forward driving current or a reverse driving current applied through the two electrode terminals 405 and 406.

FIGS. 10 and 11 are views representing a second circuit configuration employing five electrode terminals.

Referring to FIGS. 10 and 11, five electrode terminals 412 to 416 are formed on a bottom surface 411 of the substrate. The five electrode terminals 412 to 416 serve as a common anode terminal 412 of the diodes (White LED, Red LED, Green LED and Blue LED) and cathode terminals 413 to 416 of the diodes (White LED, Red LED, Green LED and Blue LED), respectively.

FIGS. 12 and 13 are views representing a third circuit configuration employing six electrode terminals.

Referring to FIGS. 12 and 13, six electrode terminals 422 to 427 are formed on a bottom surface 421 of the substrate. Two electrode terminals 422 and 425 of the six electrode terminals 422 to 427 are connected to both ends of the white LED, and the remaining four electrode terminals 423, 424, 426 and 427 serve as a common anode terminal 423 and cathode terminals 424, 426 and 427 of the three color light emitting diodes (Red, Green and Blue LEDs), respectively.

FIGS. 14 and 15 are view representing a fourth circuit configuration employing eight electrode terminals.

Referring to FIGS. 14 and 15, eight electrode terminals 432 to 439 are formed on a bottom surface 431 of the substrate. The eight electrode terminals 432 to 439 are connected to both electrode terminals of the four-color LEDs, respectively. That is, the eight electrode terminals 432 to 439 are connected to both electrode terminals of the white LED (W), the red LED (R), the green LED (G) and the blue LED (B), respectively. Since the electrode terminal is individually connected to each LED, the white LED and the three color light LEDs can selectively emit seven color lights.

According to the embodiment, a circuit configuration of electrode terminals described above may be changed depending on the circuit pattern, the configuration of the electrode pad, the number of light emitting diodes and the operating scheme.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

INDUSTRIAL APPLICABILITY

According to the light emitting device and the method of manufacturing the same of the embodiment, the white color diode and three color diodes, which can be individually driven, are prepared in the form of a package, so that the light emitting device can be used for a flash light source of a portable terminal.

In addition, the embodiment can provide a package, capable of selectively emitting white light or other light.

Further, the white color diode and the three color light emitting diodes are simultaneously driven in the package when emitting white light, so that the color rendering characteristics and the bright intensity can be improved as compared with those of the conventional package.

In addition, the embodiment can provide an indicator package by using multi-color light source.

The invention claimed is:

1. A light emitting device comprising:
a substrate comprising a cavity surrounded by a side surface;
a multi-color light emitting unit on a first region of the cavity; and
a white light emitting unit on a second region of the cavity,
wherein the side surface is coated with at least one of Ag and Al,
wherein a height of the cavity from a bottom surface of the first region is different from a height of the cavity from a bottom surface of the second region, and
wherein a first plurality of lead frames connected to the multi-color light emitting unit is disposed on the first region of the cavity and a second plurality of lead frames connected to the white light emitting unit is disposed on the second region of the cavity, and at least one of the first plurality of lead frames and at least one of the second plurality of lead frames are electrically connected through a via hole.

2. The light emitting device as claimed in claim 1, wherein the first region and the second region of the cavity are on different layers.

3. The light emitting device as claimed in claim 1, wherein the cavity comprises a first cavity, in which the multi-color light emitting unit is formed, and a second cavity, in which the white light emitting unit is formed.

4. The light emitting device as claimed in claim 3, wherein the first and second cavities comprise one of a circular shape, an oval shape and a polygonal shape.

5. The light emitting device as claimed in claim 1, wherein the white light emitting unit comprises:
at least one blue light emitting diode (LED) or UV (Ultra Violet) LED; and
a mold member to which at least one type of fluorescent substances exited by light emitted from the blue LED or the UV LED, are added.

6. The light emitting device as claimed in claim 1, wherein the multi-color light emitting unit comprises at least one red LED, green LED and blue LED.

7. The light emitting device as claimed in claim 1, wherein LEDs of the white light emitting unit and the multi-color light emitting unit are selectively driven through an individual driving scheme, a full driving scheme and a local driving scheme.

8. The light emitting device as claimed in claim 1, wherein the substrate comprises a plurality of layers, and a plurality of electrode terminals on a bottom surface of the substrate.

9. The light emitting device as claimed in claim 1, wherein the white light emitting unit or the multi-color light emitting unit is on any one of a left side region and a right side region.

10. The light emitting device as claimed in claim 1, wherein the white light emitting unit is at a center of the cavity, and the multi-color light emitting unit is around the white light emitting unit in a triangular structure.

11. The light emitting device claimed in claim 1, wherein the side surface of the cavity is inclined.

12. The light emitting device as claimed in claim 5, wherein the mold member is formed at a center of the cavity in a form of a cylinder or a poly-column.

13. The light emitting device as claimed in claim 3, comprising:
a first mold member in the first cavity;
a second mold member in the second cavity, which is formed in the first cavity, below the first mold member; and
a lens on the first mold member.

14. A light emitting device comprising:
a substrate comprising a cavity surrounded by a side surface;
a white light emitting unit on a second region of the cavity and comprising at least one blue LED and a fluorescent substance; and
a multi-color light emitting unit on a first region of the cavity and comprising at least one red LED, green LED and blue LED,
wherein the side surface is coated with at least one of Ag and Al,
wherein a height of the cavity from a bottom surface of the first region is different from a height of the cavity from a bottom surface of the second region, and
wherein a first plurality of lead frames connected to the multi-color light emitting unit is disposed on the first region of the cavity and a second plurality of lead frames connected to the white light emitting unit is disposed on the second region of the cavity, and at least one of the first plurality of lead frames and at least one of the second plurality of lead frames are electrically connected through a via hole.

15. The light emitting device as claimed in claim 14, wherein the first region and the second region of the cavity are on different layers.

16. The light emitting device as claimed in claim 14, wherein the blue LED of the white light emitting unit and the red LED, the green LED and the blue LED of the multi-color light emitting unit are driven through one of an individual driving scheme, a full driving scheme and a local driving scheme.

17. The light emitting device as claimed in claim 14, wherein a plurality of electrode terminals are on a bottom surface of the substrate so as to be connected to the lead frames.

18. A method of manufacturing a light emitting device, the method comprising the steps of:
forming a cavity in a substrate, wherein the cavity is surrounded by a side surface;
coating the side surface with at least one of Ag and Al;
mounting a red LED, a green LED and a blue LED on a first region of the cavity;
mounting a blue LED on a second region of the cavity;

forming a second mold member, to which a fluorescent substance is added, on the second region of the cavity; and forming a first mold member on the first region of the cavity after the second mold member has been cured, wherein a height of the cavity from a bottom surface of the first region is different from a height of the cavity from a bottom surface of the second region, and wherein a first plurality of lead frames is disposed on the first region of the cavity and a second plurality of lead frames is disposed on the second region of the cavity, and electrically connecting at least one of the first plurality of lead frames and at least one of the second plurality of lead frames through a via hole.

19. The method as claimed in claim 18, wherein the first region and the second region of the cavity are formed on different layers.

20. The method as claimed in claim 18, wherein the second mold member is formed below the first mold member.

* * * * *